United States Patent
Margulis

(10) Patent No.: US 11,265,085 B2
(45) Date of Patent: Mar. 1, 2022

(54) DETECTION CIRCUIT HAVING REDUCED NOISE

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 397 days.

(21) Appl. No.: 16/524,884

(22) Filed: Jul. 29, 2019

(65) Prior Publication Data

US 2021/0036782 A1 Feb. 4, 2021

(51) Int. Cl.
*H03F 3/08* (2006.01)
*H04B 10/69* (2013.01)

(52) U.S. Cl.
CPC ............. *H04B 10/691* (2013.01); *H03F 3/08* (2013.01)

(58) Field of Classification Search
CPC ........................................... H03F 3/08
USPC ...................... 330/308; 250/214 A
See application file for complete search history.

(56) References Cited

U.S. PATENT DOCUMENTS

| | | | | |
|---|---|---|---|---|
| 7,385,170 B1* | 6/2008 | Krumberger | ............... | H03F 1/08 250/214 A |
| 7,406,268 B2* | 7/2008 | Schrodinger | ...... | H04B 10/6933 250/214 A |
| 7,411,460 B2* | 8/2008 | Randlett | ............. | H03F 3/45475 330/308 |
| 7,418,213 B2* | 8/2008 | Denoyer | ................... | H03F 1/30 398/210 |
| 8,471,639 B2* | 6/2013 | Welch | ................. | H03F 3/45968 330/308 |

* cited by examiner

*Primary Examiner* — Henry Choe
(74) *Attorney, Agent, or Firm* — Kilpatrick Townsend & Stockton LLP

(57) ABSTRACT

There may be provided detection circuit that may include (i) a photodiode that may be configured to convert radiation to a photodiode electrical signal; (ii) a photodiode bias circuit that may be configured to bias the photodiode, wherein the photodiode bias circuit may include a photodiode bias voltage supply and a photodiode bias capacitor; and (iii) a differential transimpedance amplifier that may be configured to amplify the photodiode electrical signal to provide a differential voltage. The differential transimpedance amplifier may include an amplification circuit and an additional circuit, wherein the amplification circuit may include a positive input port, a negative input port, a positive output port, a negative output port and a common mode input port. The photodiode bias voltage supply may be a floating voltage supply.

10 Claims, 3 Drawing Sheets

DETECTION CIRCUIT HAVING REDUCED NOISE

BACKGROUND

A detection circuit may include a photodiode bias circuit, a photodiode, and a differential transimpedance amplifier.

The photodiode converts radiation signals to electrical signals. The photodiode is biased by the photodiode bias circuit. The photodiode bias circuit includes a photodiode bias voltage supply, a photodiode bias resistor and a photodiode bias capacitor. The photodiode bias voltage supply is grounded. The photodiode bias capacitor is grounded.

The electrical signal outputted from the photodiode is relatively weak and has to be amplified.

A differential trans-impedance amplifier is used to amplify the electrical signal outputted from the photodiode. The differential trans-impedance amplifier has a fast response and may be used in conjunction with fast photodiodes.

The differential trans-impedance amplifier has an amplification circuit that includes a common mode input that is fed by a common mode voltage supply. The common mode voltage supply is grounded.

The detection circuit may exhibit a relatively high noise.

There is a growing need to provide a detection circuit with a lower noise.

SUMMARY

There may be provided detection circuit that may include (i) a photodiode that may be configured to convert radiation to a photodiode electrical signal; (ii) a photodiode bias circuit that may be configured to bias the photodiode, wherein the photodiode bias circuit may include a photodiode bias voltage supply and a photodiode bias capacitor; and (iii) a differential transimpedance amplifier that may be configured to amplify the photodiode electrical signal to provide a differential voltage. The differential transimpedance amplifier may include an amplification circuit and an additional circuit, wherein the amplification circuit may include a positive input port, a negative input port, a positive output port, a negative output port and a common mode input port. The photodiode bias voltage supply may be a floating voltage supply.

There may be provided a method for detecting radiation, the method may include (i) biasing a photodiode by a photodiode bias circuit; wherein the photodiode bias circuit may include a photodiode bias voltage supply and a photodiode bias capacitor; wherein the photodiode bias voltage supply may be a floating voltage supply; (ii) converting, by a photodiode, radiation that impinges on the photodiode to a photodiode electrical current; and (iii) amplifying, by a differential transimpedance amplifier, the photodiode electrical current to provide a differential voltage; wherein the differential transimpedance amplifier may include an amplification circuit that may include a positive input port, a negative input port, a positive output port, a negative output port and a common mode input port.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
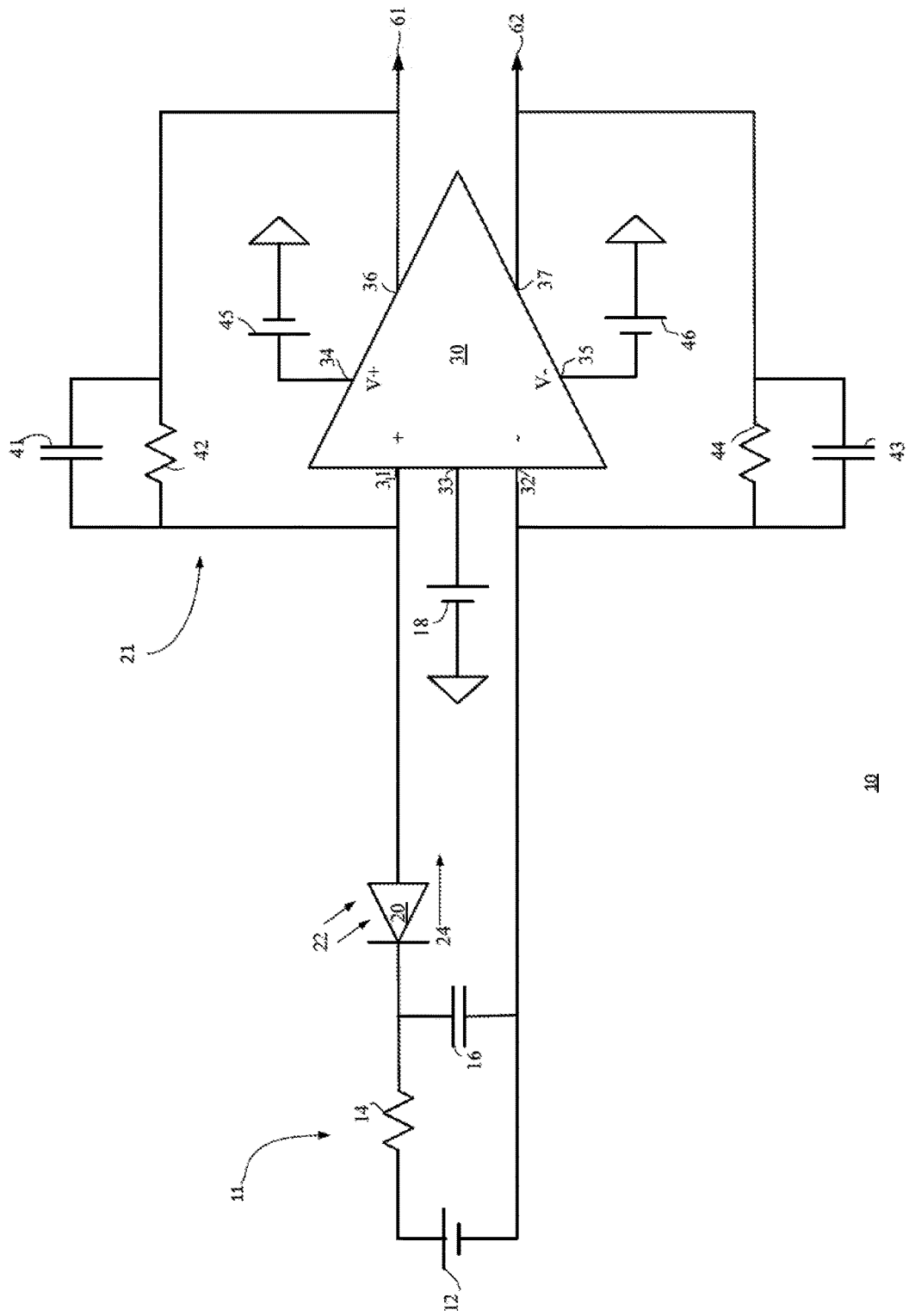
FIG. 1 illustrates an example of a detection circuit.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a detection circuit capable of executing the method.

Any reference in the specification to a detection circuit should be applied mutatis mutandis to a method that may be executed by the detection circuit.

The term "and/or" means additionally or alternatively.

There may be provided a detection circuit with a low noise.

FIG. 1 illustrates an example of detection circuit 10.

The detection circuit 10 includes a photodiode bias circuit 11, a photodiode 20, and a differential transimpedance amplifier 21. The differential transimpedance amplifier 21 includes amplification circuit 30 and an additional circuit.

The additional circuit includes a common mode voltage supply 18, a second feedback capacitor 41, a second feedback resistor 42, a first feedback capacitor 43, a first feedback resistor 44, a positive voltage supply 45, and a negative voltage supply 46.

The photodiode bias circuit 11 includes a photodiode bias voltage supply 12, a photodiode bias resistor 14, and a photodiode bias capacitor 16. The photodiode bias voltage supply 12 is not grounded and is a floating voltage supply.

The amplification circuit 30 includes a positive input port 31, a common mode input port 33, a negative input port 32, a positive supply port 34, a negative supply port 35, a positive output port 37, and a negative output port 36.

The common mode input port 33 is connected to a positive terminal of the common mode voltage supply 18. A negative terminal of the common mode voltage supply 18 is grounded.

The positive supply port 34 is connected to a positive terminal of the positive voltage supply 45. A negative terminal of the positive voltage supply 45 is grounded.

The negative supply port 35 is connected to a negative terminal of the negative voltage supply 46. A positive terminal of the negative voltage supply 46 is grounded.

A cathode of the photodiode 20 is connected to a second end of the photodiode bias capacitor 16 and to a first end of the photodiode bias resistor 14.

A positive terminal of the photodiode bias voltage supply 12 is connected to a second end of the photodiode bias resistor 14.

A negative terminal of the photodiode bias voltage supply 12, a first end of the photodiode bias capacitor 16, the negative input port 32, a first end of the first feedback resistor 44, and a first end of the first feedback capacitor 43 are connected to each other.

An anode of the photodiode 20, the positive input port 31, a first end of the second feedback resistor 42, and a first end of the second feedback capacitor 41 are connected to each other.

A second end of the second feedback resistor 42, a second end of the second feedback capacitor 41 and the negative output port 36 are connected to each other.

A second end of the first feedback resistor 44, a second end of the first feedback capacitor 43 and the positive output port 37 are connected to each other.

FIG. 1 also illustrates a radiation 22 that impinges on the photodiode 20. The photodiode 20 converts the radiation 22 to a photodiode current I 24 that flows through the photodiode 20.

The positive output port 62 outputs a positive output voltage Vout_p.

The negative output port 61 outputs a negative output voltage Vout_n.

The difference between Vout_p and Vout_n is referred to as differential output voltage Vdiff.

The common mode voltage supply 18 provides a common mode voltage Vcm.

The resistance of the second feedback resistor 42 and the resistance of the first feedback resistor 44 is Rf.

$$Vout\_p = Vcm + I*Rf$$

$$Vout\_n = Vcm - I*Rf$$

$$Vdiff = Vout\_p - Vout\_n = 2*I*Rf$$

Accordingly—the gain of the differential transimpedance amplifier 21 is 2*Rf.

The noise outputted by the differential transimpedance amplifier 21 may be represented by an input noise current (inputted to the differential transimpedance amplifier 21) of Vout_noise/2*Rf.

The gain of the detection circuit is twice than the gain of a prior art detection circuit that uses a grounded photodiode bias voltage supply and a grounded photodiode bias capacitor.

Figure 2:
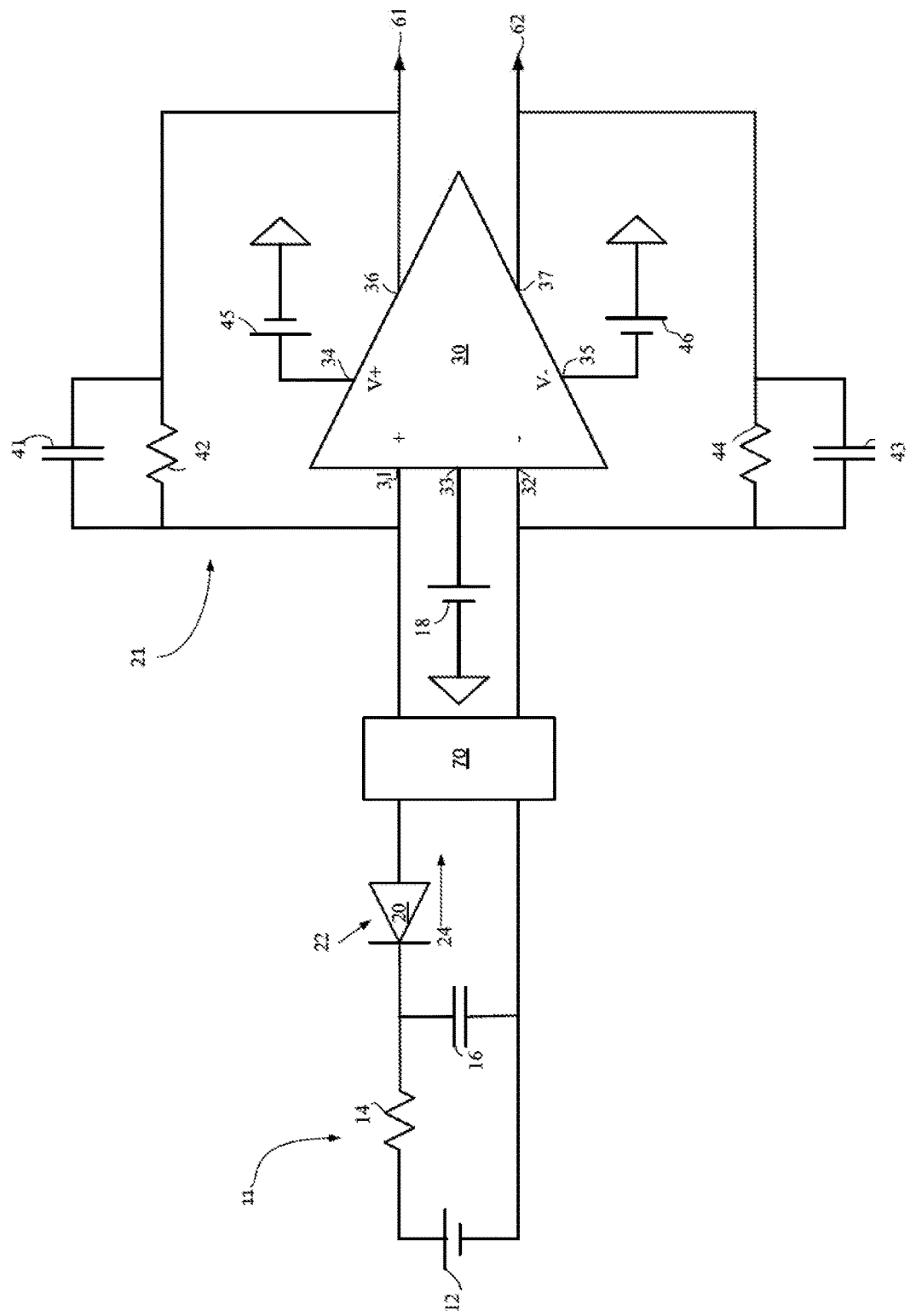
FIG. 2 illustrates an example of a detection circuit.

FIG. 2 illustrates an example of detection circuit 10'.

Detection circuit 10' of FIG. 2 differs from the detection circuit 10 of FIG. 1 by having a current buffer 70.

A first input of current buffer 70 is connected to the anode of photodiode 20.

A second input of current buffer 70 is connected to the negative terminal of the photodiode bias voltage supply 12 and to the first end of the photodiode bias capacitor 16.

A first output of current buffer 70 is connected to the positive input port 31, the first end of the second feedback resistor 42, and the first end of the second feedback capacitor 41.

A second output of current buffer 70 is connected to the negative input port 32, the first end of the first feedback resistor 44, and the first end of the first feedback capacitor 43.

Figure 3:
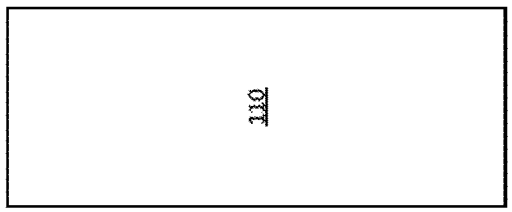
FIG. 3 illustrates an example of a method.
Figure 3:
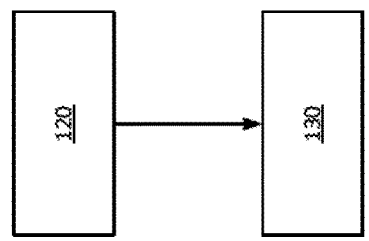

FIG. 3 is an example of method 100.

Method 100 may be for detecting radiation.

Method 100 may start by steps 110 and 120.

Step 110 may include biasing a photodiode by a photodiode bias circuit. The photodiode bias circuit may include a photodiode bias voltage supply and a photodiode bias capacitor. The photodiode bias voltage supply may be a floating voltage supply.

Method 100 may also include step 120 of converting, by a photodiode, radiation that impinges on the photodiode to a photodiode electrical current.

Step 120 may be followed by step 130 of amplifying, by a differential transimpedance amplifier, the photodiode electrical current to provide a differential output voltage. The differential transimpedance amplifier includes an amplification circuit that includes a positive input port, a negative input port, a positive output port, a negative output port and a common mode input port.

Steps 120 and 130 may be executed while step 110 is executed.

Step 110 may be executed in a continuous or non-continuous manner. For example—step 110 may be executed when the detection circuit is active and may be terminated when the detection circuit is idle or shut down.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A detection circuit comprising:
    a photodiode that is configured to convert radiation to a photodiode electrical signal;
    a photodiode bias circuit that is configured to bias the photodiode; wherein the photodiode bias circuit comprises a photodiode bias voltage supply and a photodiode bias capacitor;
    a differential transimpedance amplifier that is configured to amplify the photodiode electrical signal to provide a differential voltage; and
    wherein the differential transimpedance amplifier comprises an amplification circuit and an additional circuit, wherein the amplification circuit comprises a positive input port, a negative input port, a positive output port, a negative output port and a common mode input port; and
    wherein the photodiode bias voltage supply is a floating voltage supply.

2. The detection circuit according to claim 1 wherein the photodiode bias voltage supply comprises a negative terminal and a positive terminal;
    wherein the photodiode comprise a cathode and an anode;
    wherein a first end of the photodiode bias capacitor and the negative terminal of the photodiode bias voltage supply are ungrounded and are coupled to the negative input port of the amplification circuit.

3. The detection circuit according to claim 2 comprising a first feedback resistor and a first feedback capacitor; wherein the first end of the photodiode bias capacitor and the negative terminal of the photodiode bias voltage supply are further coupled to a first end of the first feedback resistor and to a second end of the first feedback capacitor.

4. The detection circuit according to claim 1 comprising a current buffer.

5. The detection circuit according to claim 4 wherein the current buffer comprises a first input, a second input, a first output and a second output;
    wherein the first end of the photodiode bias capacitor and a negative terminal of the photodiode bias voltage supply are coupled to the second input of the current buffer; and
    wherein the second output of the current buffer is coupled to the negative input port of the amplification circuit.

6. The detection circuit according to claim 5 comprising a first feedback resistor and a first feedback capacitor; wherein the second output of the current buffer is further coupled to a first end of the first feedback resistor and to a first end of the first feedback capacitor.

7. The detection circuit according to claim 5 comprising a second feedback resistor and a second feedback capacitor; wherein the first output of the current buffer is coupled to a first end of the second feedback resistor and to a first end of the second feedback capacitor.

8. The detection circuit according to claim 7 wherein the negative output port of the amplification circuit is coupled to a second end of the second feedback resistor and to a second end of the second feedback capacitor.

9. A method for detecting radiation, the method comprises:
    biasing a photodiode by a photodiode bias circuit; wherein the photodiode bias circuit comprises a photodiode bias voltage supply and a photodiode bias capacitor;
    wherein the photodiode bias voltage supply is a floating voltage supply;
    converting, by a photodiode, radiation that impinges on the photodiode to a photodiode electrical current;
    amplifying, by a differential transimpedance amplifier, the photodiode electrical current to provide a differential voltage; wherein the differential transimpedance amplifier comprises an amplification circuit that comprises a positive input port, a negative input port, a positive output port, a negative output port and a common mode input port.

10. The method according to claim 9 wherein the photodiode bias voltage supply comprises a negative terminal and a positive terminal;

wherein the photodiode comprise a cathode and an anode; and wherein a first end of the photodiode bias capacitor and the negative terminal of the photodiode bias voltage supply are ungrounded and are coupled to the negative input port of the amplification circuit.

\* \* \* \* \*